(12) United States Patent  
Ausserlechner

(10) Patent No.: US 7,471,494 B2  
(45) Date of Patent: Dec. 30, 2008

(54) OUTPUT CIRCUIT

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 444 days.

(21) Appl. No.: 11/274,574

(22) Filed: Nov. 15, 2005

(65) Prior Publication Data

US 2006/0125524 A1 Jun. 15, 2006

(30) Foreign Application Priority Data

Nov. 15, 2004 (DE) .................. 10 2004 055 057

(51) Int. Cl.
*H02H 3/20* (2006.01)
(52) U.S. Cl. .................. 361/90; 361/91.1; 361/92
(58) Field of Classification Search ............ 361/90, 361/91.1, 92
See application file for complete search history.

(56) References Cited

U.S. PATENT DOCUMENTS

| | | | | |
|---|---|---|---|---|
| 3,679,912 A * | 7/1972 | Tenenbaum | .................. | 327/466 |
| 4,327,310 A * | 4/1982 | Jorg | ..................... | 315/209 R |
| 4,678,950 A * | 7/1987 | Mitake | ..................... | 327/321 |
| 5,771,162 A * | 6/1998 | Kwon | ..................... | 363/56.11 |
| 6,018,450 A * | 1/2000 | Ahmad et al. | ............. | 361/90 |
| 6,414,404 B1 * | 7/2002 | Allen | ..................... | 307/130 |
| 6,559,721 B2 | 5/2003 | Ausserlechner et al. | ..... | 330/264 |
| 2003/0016068 A1 | 1/2003 | Logiudice | .................. | 327/365 |
| 2003/0223162 A1 | 12/2003 | Ausserlechner et al. | ....... | 361/42 |
| 2004/0207965 A1 | 10/2004 | Ausserlechner | .............. | 361/56 |

FOREIGN PATENT DOCUMENTS

| | | |
|---|---|---|
| DE | 101 55 534 A1 | 11/2001 |
| DE | 103 14 601 A1 | 3/2003 |
| WO | 02/15392 A2 | 2/2002 |

OTHER PUBLICATIONS

U, Tietze & Ch. Schenk, "Halbeiter-Schaltungstechnik". Springer Verlag, Fig. 7.33, p. 154, Edition 1989.

* cited by examiner

*Primary Examiner*—Stephen W Jackson
*Assistant Examiner*—Terrence R Willoughby
(74) *Attorney, Agent, or Firm*—Eschweiler & Associates, LLC

(57) ABSTRACT

An output circuit for a circuit includes an input node coupled to the circuit, an output node, a reference potential terminal, a supply potential terminal, a semiconductor switch connected between the input node and the output node, and a control circuit. The control circuit is designed to open the semiconductor switch when the potential at the output node is higher than a first limit potential depending on a potential applied to the supply potential terminal, or when the potential is lower than a second limit potential depending on a potential applied to the reference potential terminal, and to close the semiconductor switch when the potential is between the first and the second limit potential. Such an output circuit has the advantage that the circuit is protected both against an overvoltage applied to the output node and a polarity inversion, wherein only monolithically integratable semiconductor devices are used.

36 Claims, 4 Drawing Sheets

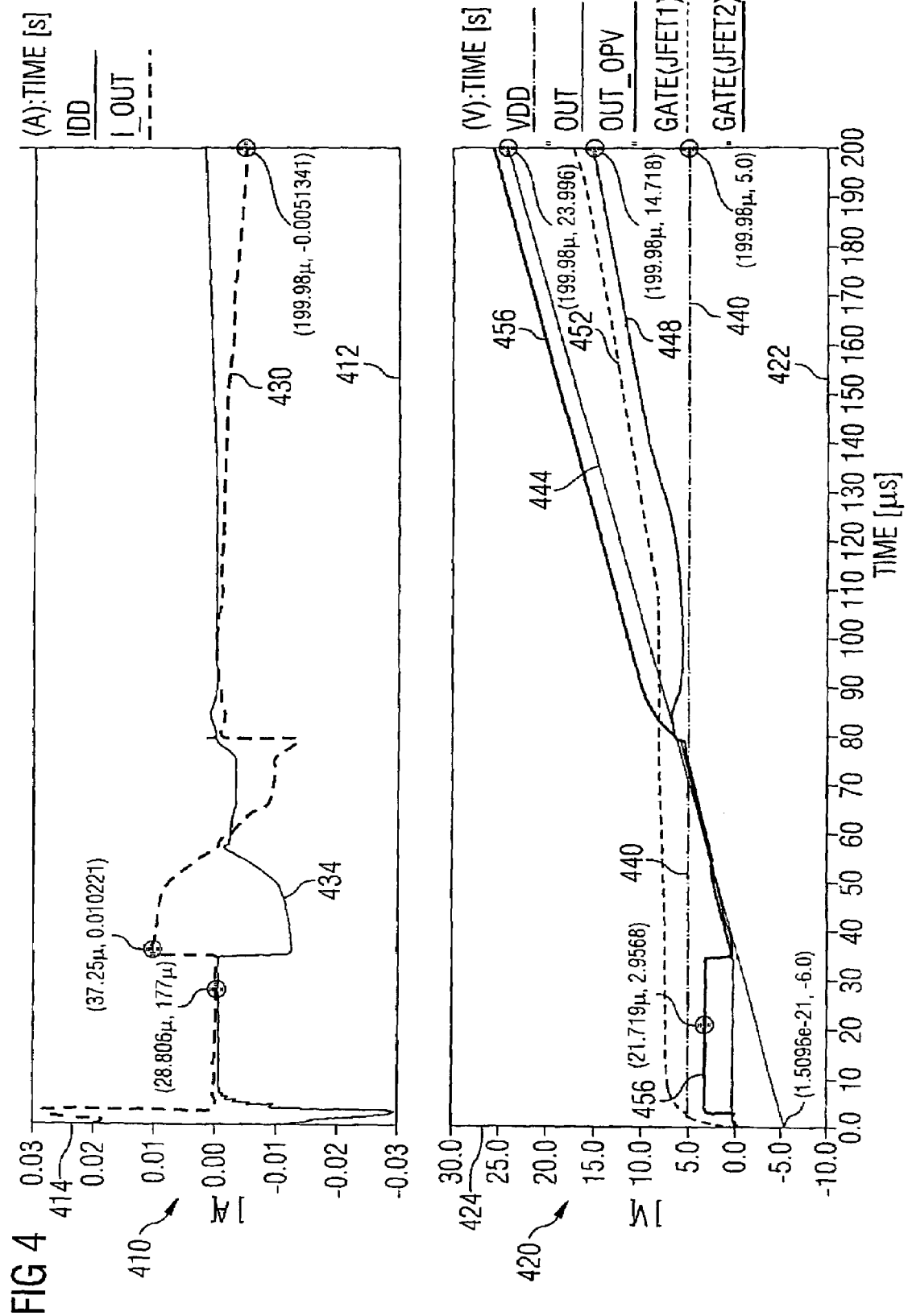

OUTPUT CIRCUIT

CROSS-REFERENCE TO RELATED APPLICATIONS

This application claims priority from German Patent Application No. 10 2004 055 057.3, which was filed on Nov. 15, 2004, and is incorporated herein by reference in its entirety.

TECHNICAL FIELD

The present invention generally relates to an output circuit, particularly to an output circuit protecting a circuit output of a sensor from overvoltage and polarity inversion and allowing a detection of errors on the supply lines of the sensor.

BACKGROUND

In integrated sensors having three terminal lines VDD (positive supply voltage pin), GND (negative supply voltage pin) and OUT (output voltage pin), wherein the measured quantity of the sensor is output at OUT in the form of a mostly analog output voltage, there is occasionally used an OBD system (open bond system). As, in many cases, for example in vehicle applications, sensors are connected to an evaluating unit via long lines, it may occur that one of these lines is opened (line interruption) or is short-circuited to another line. In order to be able to detect an opened line, there is the OBD system. All terminals on a chip are connected to normally-on structures. If the integrated circuit (IC) contained on the chip is in normal operation, these normally-on structures are switched high-ohmic and do not affect the operation, at least not substantially. If, however, one of the supply lines breaks, the normally-on structures become low-ohmic and connect the remaining supply pin to the output voltage pin (OUT pin). In such a case, an evaluating unit detects an error due to the voltage at the output pin, because, in normal operation, a valid voltage at the output voltage pin (OUT voltage) is prevented from coming too close to one of the two supply potentials. If the voltage at the output voltage pin (OUT) is close to the voltage VDD at the positive supply voltage pin or close to the voltage GND at the negative supply voltage pin, this condition will be described in the following by the term "the output voltage OUT is in an error band", as by convention.

As the described normally-on structures are directly at the pins, they may be used at the same time to realize further properties of the integrated circuit (IC). In particular, this includes a reverse-connect protection (or polarity inversion protection) at the positive supply voltage pin VDD and the output voltage pin OUT. A polarity inversion protection becomes operative if a potential is turned on at the respective pins which is negative with respect to the potential at the negative supply voltage pin GND. Also, an overvoltage protection may be realized which fulfills a protective function when the potential at the output voltage pin OUT is larger than the potential at the positive supply voltage pin VDD. An overvoltage at the output voltage pin OUT occurs, for example, if there is a short circuit towards a high potential at the output voltage pin OUT.

Furthermore, the normally-on structures may be used for signaling certain events. In the case of an overvoltage, for example, i.e. if the operating voltage is so large that the integrated circuit (IC) is no longer operating properly, but is not destroyed yet either, a potential close to the potential VDD at the positive supply voltage pin or close to the potential GND at the negative supply voltage pin may be output at the output voltage pin OUT. Such a potential at the output voltage pin OUT is in the error band according to the above convention.

The German patent application, application number 10314601 shows a semiconductor circuit with a protective circuit. It uses a p-channel junction field effect transistor to realize a polarity inversion protection. If the potential at a node and/or pin to which the normally-on p-channel junction field effect transistor is connected is negative with respect to a reference potential (GND), the p-channel junction field effect transistor limits the current flow in a better way than it is achieved using alternative circuit solutions, for example a protective resistor. The protective circuit is thus suitable for the protection of a positive supply voltage pin (VDD) or an output voltage pin (OUT).

WO 02/15392 A2 shows a circuitry for the detection of an error condition with respect to the operating voltage supply of a sensor. For example, the interruption of a supply line may be detected by means of the shown circuitry. The shown circuitry provides a transistor of the normally-on type connected between a supply voltage terminal and an output terminal. In a normal operating condition, a drive circuit generates a voltage at its control input that pinches off the channel. In an error condition, the channel of the transistor is low-resistance conducting. By means of the shown circuitry, the output of a linear amplifier stage may preferably be applied to the intact potential in the case of an interruption of a supply line. This allows the detection of an error condition in a downstream evaluating circuit.

U.S. Pat. No. 6,559,721 B2 shows a circuitry with an integrated amplifier. The amplifier comprises an output stage connected to a supply potential terminal and a reference potential terminal. A pair of complementary output transistors couple the amplifier to a tri-state output. In the case that one of the operating voltage feeds connected to the reference potential terminal and the supply potential terminal in a normal operating condition is interrupted, the tri-state output is put into a high-ohmic condition by the circuitry. In order to achieve this, two blocking transistors are provided whose control terminals are supplied by associated charge pump circuits. In sensor applications, in which high reliability is required, such a circuitry allows, for example, to avoid misinterpretation of measurement results in the case of disturbances. With the help of a shown circuitry, this is possible with little effort.

US 2003/0016068 A1 shows a circuitry for discharging a circuit node. It may be employed in OBD circuits. The discharge of a circuit node is done via a field effect transistor whose gate terminal, after turning off the supply voltage, is kept to such a potential that the drain source path is conductive and discharges a node to be discharged. In a normal operating condition, however, the drain source path is blocked so that the discharge circuit is deactivated and does not represent any further load.

SUMMARY

It is the object of the present invention to provide an output circuit protecting a circuit node both from polarity inversion and from overvoltage.

The present invention provides an output circuit for a circuit, having an input node coupled to the circuit; an output node; a reference potential terminal; a supply potential terminal; a semiconductor switch between the input node and the output node; a control circuit designed to open the semiconductor switch, when the potential at the output node is higher than a first limit potential depending on a potential applied to the supply potential terminal; or when the potential at the output node is lower than a second limit potential depending on a potential applied to the reference potential terminal; and to close the semiconductor switch when the potential at the output node is between the first and the second limit potential.

The present invention provides an output circuit for a circuit having an input node coupled to the circuit, an output node, a reference potential terminal, a supply potential terminal, a semiconductor switch between the input node and the output node, and a control circuit designed to open the semiconductor switch when the potential at the output node is higher than a first limit potential depending on a potential applied to the supply potential terminal, or when the potential at the output node is lower than a second limit potential depending on a potential applied to the reference potential terminal, and designed to close the semiconductor switch when the potential at the output node is between the first and the second limit potential.

The main idea of the present invention is that it is advantageous to drive a semiconductor switch so that it is open when a too high or too low potential is applied to an output node connected to the semiconductor switch. It was found that it is possible to switch a single semiconductor switch to a high-ohmic condition both in the presence of an undervoltage and in the presence of an overvoltage. In this, an inventive circuitry differs considerably from conventional circuitries in which semiconductor switches for overvoltage and/or polarity inversion protection are driven so that they assume a high-ohmic condition either in the case of an overvoltage or in the case of an undervoltage. Thus, with conventional output circuits using a semiconductor switch, there may only be achieved a protection either against polarity inversion of the potential at the output node or against the application of an overvoltage at the output node. An inventive output circuit, however, allows protection from both of these error conditions.

So it is the main idea of the invention that a single semiconductor switch may be turned off by an appropriate drive both if there is a potential at its output terminal higher than an upper limit potential, and if there is a potential at its output terminal lower than a lower limit potential. If the potential is between the upper and the lower limit potential, the semiconductor switch may be turned on.

It is an advantage of an inventive output circuit that only one semiconductor switch is necessary for the protection from overvoltage and undervoltage. This reduces the resistance of the circuitry in a turned on condition as compared to solutions in which two or more semiconductor switches are necessary. Accordingly, the voltage drop across the semiconductor switch is lower than in conventional solutions. Thus it is possible with an inventive output circuit to drive bigger loads than it is possible with conventional circuitries, with an otherwise unchanged circuitry. The use of only one semiconductor switch further saves costs as compared to conventional solutions and leads to a reduction of the size of a protective circuit.

It is further advantageous to use only one semiconductor switch, because thus only exactly two conditions (semiconductor switch opened, semiconductor switch closed) are possible. This simplifies a drive circuit.

It is a further an advantage of an inventive circuitry that the semiconductor switch always disconnects the same current path, i.e. the connection between an input node and an output node, in the case of overvoltage or polarity inversion. This is opposed to conventional circuitries which may be designed to disconnect a first signal path in the case of overvoltage and to disconnect a second signal path in the case of polarity inversion. Thus, in conventional output circuits, the circuitry preceding the output circuit has to be designed so that one circuit part only has to be protected from overvoltage and one circuit part only has to be protected from polarity inversion. However, when using an inventive output circuit, it is possible to have any circuitry comprising only one output precede the output circuit. This output is protected both from overvoltage and polarity inversion. The inventive output circuit thus provides protection for a preceding circuit having only one output node, as opposed to the conventional protection for two separate branches of a preceding circuitry. Thus an inventive output circuit may be employed without changing the preceding circuitry in its structure.

It is further advantageous to employ only one semiconductor switch, because in this case also only one drive circuit for the semiconductor switch is necessary. Thus, the overall circuit requirements are reduced as compared to conventional circuits using separate semiconductor switches for an overvoltage condition and for a polarity inversion condition.

Finally, it is to be noted that it is only an inventive circuitry in connection with a circuitry preceding the output circuit that has made a combined protection from overvoltage and polarity inversion using semiconductor elements possible in the first place. Furthermore there is also the possibility to allow detection of an interruption of a supply potential feed in addition to the protection from overvoltage and polarity inversion.

In a preferred embodiment, the semiconductor switch is a normally-on field effect transistor. Such an implementation is advantageous because a normally-on field effect transistor is conductive exactly when it does not receive any signal from a drive circuit. This may be the case, for example, when a supply voltage is interrupted. It may be advantageous that the semiconductor switch is closed in this case, if, for example, signaling of such an error condition is to be performed by a circuitry preceding the output circuit. If this feature is not necessary, in principle, a normally-off field effect transistor may also be used.

It is further preferred that the signal at the input node of the output circuit is provided by an amplifier circuit whose output may be switched to a high-ohmic condition. This has the advantage that the input node of the output circuit may be adjusted to such a potential, if needed, that a maximum electric strength of the semiconductor switch is guaranteed. Of course, the potential has to be in a range such that the output of the amplifier circuit is not damaged. However, this condition may be met for a suitable circuit dimensioning. If the output of the amplifier circuit is high-ohmic, it is possible that the potential at the input node of the output circuit adjusts itself independently, wherein a stable balance point is reached. It is further possible that further circuit elements are also involved in the adjustment of the balance of the semiconductor switch.

It is further preferred that the input of the amplifier circuit may optionally be coupled to an information carrying signal or to a given potential via a switching device. If the input of the amplifier circuit is coupled to a given potential, the amplifier circuit impresses a fixed potential at its output, i.e. at the input node of the output circuit. It may, in turn, be advantageous for the semiconductor switch if a fixed potential is impressed at its input node. In particular, an adjustment of the switching condition is facilitated and furthermore the electric strength of the semiconductor switch is increased.

It is advantageous to perform the driving of the semiconductor switch as flexibly as possible. For example, it is necessary in different operating conditions to use different circuitries for driving a control terminal of the semiconductor switch. It is preferred that the control circuit includes a controllable charge pump circuit whose output is coupled to a control terminal of the semiconductor switch. A controllable charge pump circuit has the advantage that, at the control terminal of the semiconductor switch, there may also be impressed potentials which are not between the reference potential applied to the reference potential terminal and the supply potential applied to the supply potential terminal. Furthermore, a charge pump circuit may also be used to generate a potential which has a fixed relationship to a given potential, for example is above or below the given potential by a given potential difference. Thus, a charge pump circuit allows maximum flexibility for an adjustment of a potential at the control terminal of the semiconductor switch.

It is further preferred that the output circuit further includes a current source whose output may be coupled to the control terminal of the semiconductor switch. The use of a real current source also comprising a saturation behavior has the advantage that the control terminal of the semiconductor switch may be pulled to an appropriate potential by a given current. In particular, it is possible to achieve voltage increases at the control terminal having a given edge steepness when there is an approximately constant capacity. The use of a current source further offers the advantage that, with a capacitive behavior, voltage changes may only occur with a limited changing speed, which results in a better response for short transient disturbances.

It is further advantageous that the output circuit includes a voltage source whose output may be coupled to the control terminal of the semiconductor switch. In the turned off condition of the semiconductor switch, it may be advantageous that the control terminal is connected to a fixed potential. The semiconductor switch may be put into an optimum block operation condition by this measure.

In a preferred embodiment, the semiconductor switch is a (normally-on) p-channel field effect transistor of the depletion type whose gate terminal serves as control terminal. Such a normally-on p-channel field effect transistor has the advantage that it may be implemented in a polarity inversion-resistant way on a conventional p-substrate. That is, if a potential which is negative with respect to the substrate is applied to its source or drain terminal, there is no parasitic diode allowing a large current flow. Accordingly, p-channel field effect transistors may ensure polarity inversion-resistance of up to 16 V.

In connection with a p-channel field effect transistor, the control circuit may preferably be designed to drive a controllable charge pump circuit so that it generates a potential at the gate electrode of the p-channel field effect transistor of the depletion type which is higher than a potential at the output node by a given potential difference, when the potential at the output node is higher than the first limit potential. Preferably, the given potential difference is selected so that it is approximately equal to a pinch-off voltage Up of the normally-on p-channel field effect transistor of the depletion type. In such a design, the p-channel field effect transistor of the depletion type is in a block operation, when an overvoltage is applied to the output node, i.e. when the potential at the output node is higher than the first limit potential. It is further to be noted that the adaptation of the gate potential to the potential at the output node done by the charge pump circuit prevents the occurrence of too large a gate source and/or gate drain potential difference. The same could destroy the transistor and is thus avoided by the implementation described above. Therefore, the use of a charge pump circuit is very advantageous.

In a further preferred embodiment, the control circuit is designed to switch the output of the amplifier circuit to a high-ohmic condition, when the potential at the output node is higher than the first limit potential. Such a measure allows the input node, which is operative here as drain node of the normally-on p-channel field effect transistor, to adjust to a potential where neither the drain source path nor the drain gate path breaks. If, however, the input node was pulled to a given potential, it may happen that the drain source potential difference and/or the drain gate potential difference becomes so large that there is a breakdown of the transistor. This could result in a high current flow and eventually destroy the transistor.

In a further preferred embodiment, the control circuit is designed to couple the voltage source to the gate electrode of the normally-on p-channel field effect transistor and to couple the input of the amplifier circuit to a given potential, wherein the amplifier circuit, the given potential and the voltage source are designed so that, at the input node coupled to a source electrode of the p-channel field effect transistor of the depletion type, a potential is applied which is not lower than the second limit potential, when the potential at the output node is lower than the second limit potential. Furthermore, it must be guaranteed in this case that a potential is applied to the gate electrode which is higher than the potential at the input node by at least a pinch-off voltage of the normally-on p-channel field effect transistor. Such an adjustment of the potentials ensures that the normally-on p-channel field effect transistor is reliably in a turned off condition. The potential at the input node, which is equal to the source potential of the transistor here, is reliably larger than the potential at the output node, which is equal to the drain potential of the transistor. The gate potential of the transistor is, in turn, at least a pinch-off voltage above the source potential of the transistor. This ensures that the transistor is in the turned off operating condition in which its channel is high-ohmic. The amplifier preceding the semiconductor switch serves to impress a potential to the source terminal of the p-channel field effect transistor of the depletion type. This potential is preferably chosen close to the second lower limit potential. This achieves that the drain source voltage and the drain gate voltage are kept at a minimum in the case of polarity inversion. In turn, this serves to avoid that the normally-on p-channel field effect transistor breaks down. Thus, the p-channel field effect transistor of the depletion type is able, by means of this circuit, to tolerate a maximum negative potential at the output node without destruction. Here, the gate source voltage of the transistor is set independently of the potential at the output node. Thus, the transistor is reliably turned off.

Tracking of the gate potential so that it follows the potential at the output node is not convenient, because, in this case, the potential at the input node would also have to be tracked. Without tracking the potential at the input node which, in this case, acts as source potential of the transistor (the source potential is defined as the more positive one of the two potentials applied to the channel in a p-channel field effect transistor), the transistor would become conductive with a sufficiently negative gate potential. This is not desired. The advantage of a circuitry in which gate and source potentials do not track the potential at the output node is further that a charge pump circuit is not required in this operating condition.

In a further preferred embodiment, the control circuit is designed to couple the current source to the gate electrode of the normally-on p-channel field effect transistor, so that a potential at the gate electrode of the p-channel field effect transistor is kept as close as possible to the reference potential, when the potential at the output node is between the first and the second limit potential. The advantage of such a circuit is that the gate electrode of the p-channel field effect transistor of the depletion type is kept at a potential as low as possible, so that the channel of the transistor is low resistance conductive for the potentials occurring in this operating condition at the input node and the output node. The connection with a current source causes the discharge current for the gate electrode to be well-defined. Even in transient processes, the transistor does not leave the intended working range and remains well-conductive.

In a further preferred embodiment, the control circuit is designed to detect a change of the condition, starting from a condition in which the potential at the output node is between the first and the second limit potential, only when the potential at the output node is larger than the first limit potential or smaller than the second limit potential for longer than a given time duration. Such an implementation results in the control circuit blocking out short-term variations of the potential at the output node which may be caused by high-frequency disturbances. The control circuit is thus not sensitive to short disturbance peaks. However, short disturbance peaks do not result in thermal overload with a suitable design of the circuitry, so that it is allowable to tolerate them without the output circuit disconnecting the semiconductor switch. The maximum allowable time duration for such disturbing impulses may be between 0.1 μs and 10 μs. Such a circuit design has the decisive advantage that the output circuit responds to high frequency disturbances in a much less vulnerable way than conventional circuits.

It is further preferred that the first limit potential is about 0.7 V above the positive supply potential. In turn, such an adjustment provides that smaller disturbances at the output node do not result in a transition to the error operating condition. Instead, there is a tolerance range in which overvoltage at the output node is acceptable. A low overvoltage does not result in such a high current that there is a destruction of the circuitry. Thus, low overvoltage may be tolerated increasing the reliability of the output circuit. It is convenient to select the upper limit potential between 0.5 V and 5 V higher than the potential at the positive supply voltage terminal.

Similarly it is preferred that the second limit potential is about 1 V lower than the potential at the reference potential terminal. Low polarity inversion, where the potential at the output terminal is more negative than the reference potential by no more than 1 V, again does not result in a destruction of a circuitry because of the comparatively small current flow and the comparatively low power dissipation and is thus tolerable.

In a further preferred embodiment, the output circuit further includes a second normally-on field effect transistor whose drain source path is connected between the input node and the reference potential terminal, and whose gate terminal is coupled to the output of a second charge pump which, when there is a sufficient potential difference between the supply potential and the reference potential, generates a potential such that the channel of the second normally-on field effect transistor is pinched off. Such a circuitry has the result that, if a sufficient supply voltage is applied which is sufficient to allow a proper operation of the circuitry, the mode of operation of the circuit is unchanged with respect to the circuitry described above. If, however, the feed of a supply potential to the supply potential terminal or the feed of a reference potential to the reference potential terminal is interrupted, the second charge pump becomes inactive. The second normally-on field effect transistor then receives a gate potential which is not sufficient to pinch off the channel. Accordingly, the channel of the second field effect transistor of the depletion type conducts. Thus, when the supply potential feed or the reference potential feed is interrupted, the output node is pulled to the remaining potential allowing the detection of an error condition in a downstream circuit. Thus, such a circuitry has the advantage that errors on the potential feeds may be detected.

Similarly, in a further preferred embodiment, the output circuit includes a third field effect transistor of the depletion type whose drain source path is connected between the input node and the supply potential terminal and whose gate terminal is coupled to the output of a third charge pump which, when there is a sufficient potential difference between the supply potential and the reference potential, generates a potential such that the channel of the third field effect transistor of the depletion type is pinched off.

In a further preferred embodiment, the gate terminal of the third field effect transistor is connected to a drive circuit designed so that a voltage drop across the drain source path of the third field effect transistor is equal to a voltage drop across the drain source path of the first field effect transistor, except for a tolerance, when the potential at the output node is higher than the first limit potential. Such a design of the drive circuit is advantageous because, in this case, a potential difference between the output node and the positive supply potential is equally divided up among the drain source paths of the first and third field effect transistors. The uniform loading of the two transistors allows that a maximum overvoltage may be tolerated at the output node (with respect to the positive supply potential). Thus a maximum overvoltage resistance at the output node is guaranteed. Preferably the drive circuit at the gate terminal of the third field effect transistor includes a resistive voltage divider. With respect to its behavior, it is very linear, easy to design and may be made with acceptable tolerances.

In a further preferred embodiment, the gate electrode of the first field effect transistor is connected so that a gate charge is reduced, when it is not actively maintained by a circuit. Such a circuitry, in turn, is useful to achieve a well-defined condition in as short a time as possible in the case of an interruption of a supply potential feed.

In a further preferred embodiment, the semiconductor switch is formed by several normally-on field effect transistors connected in series. The series connection of several transistors with respect to their channel paths results in an increase of the allowable block voltage. Thus a series connection allows an increase of the electric strength of an inventive circuitry. Corresponding gate potentials for field effect transistors connected in series may be generated by a resistive voltage division. Thus there is a very simple method to adapt an inventive circuitry to various application cases and requirements.

Similarly, the second field effect transistor or the third field effect transistor may be replaced by a series connection of several transistors. Again the electric strength of the corresponding circuit increases. It is useful to adjust the gate potentials appropriately by voltage dividers so that approximately equal drain source voltages for all transistors result. It may also be necessary with respect to the channels to adjust the potentials with the help of a high-ohmic voltage divider so that all transistors are uniformly loaded and comprise comparable drain source voltages.

Furthermore, in a preferred embodiment, an input of the amplifier circuit is coupled to the input node via a capacitor and to the output node via a resistive voltage divider network. Such a circuitry may improve the stability properties of the amplifier circuit, particularly when it is loaded with a capacitive load connected to the output node. This reduces the oscillation tendency of the amplifier circuit and a stable operation may be guaranteed even with large capacitive loads at the output node. Such capacitive loads may, for example, be generated by long line connections. Thus the capacitor and the resistive voltage divider network are preferably designed so that the stability of the amplifier circuit is improved in connection with an on-resistance of the semiconductor switch, when a capacitive load is coupled to the output node. It can be seen that the on-resistance of the semiconductor switch is used advantageously in such an implementation and thus is not to be regarded as disturbing, as it is conventionally done. Thus the inventive circuit design forms an optimum combination of semiconductor switch and amplifier circuit, wherein losses of the semiconductor switch do not have a disturbing effect, but even an advantageous one.

BRIEF DESCRIPTION OF THE DRAWINGS

Preferred embodiments of the present invention are explained in more detail in the following with respect to the accompanying drawings, in which:

FIG. 4 is a time representation of currents and voltages in an inventive output circuit for an exemplary excitation.

DETAILED DESCRIPTION

Figure 1:
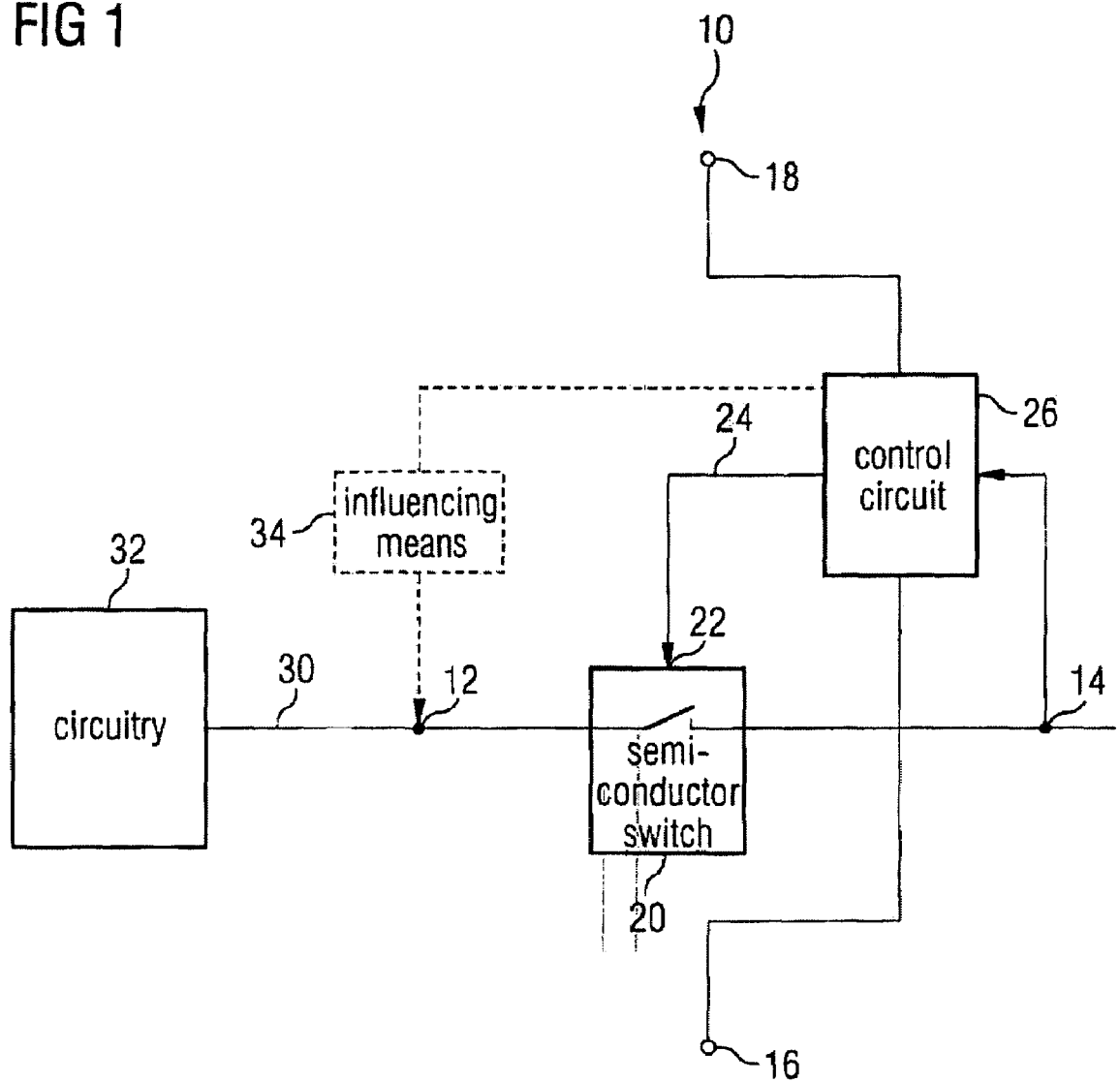
FIG. 1 is a block circuit diagram of an inventive output circuit according to a first embodiment of the present invention.

FIG. 1 shows a block circuit diagram of an inventive output circuit according to a first embodiment of the present invention. The output circuit is designated 10 in its entirety. It comprises an input node 12 and an output node 14, further a reference potential terminal 16 and a supply potential terminal 18. A semiconductor switch 20 is connected between the input node 12 and the output node 14. It receives a control signal 24 from a control circuit 26 at a control terminal 22. The control circuit 26 receives a potential from the output node 14 and is further coupled to the reference potential terminal 16 and the supply potential terminal 18. Furthermore, an input signal 30 provided by a circuitry 32 is applied to the input node 12 of the output circuit 10.

Based on the structural description, the operation of the present inventive output circuit 10 will be described in the following. It is the task of the output circuit 10 to connect the input node to the output node in a conductive way in a normal operating condition in which the potential at the output node 14 is between a lower limit potential and an upper limit potential with respect to a reference potential at the reference potential terminal 16. It is further the task of the present circuit to disconnect the input node from the output node, if an overvoltage is applied to the output node, i.e. if the potential at the output node is larger than a given first upper limit potential, or if there is a polarity inversion at the output node, i.e. if the potential at the output node 14 is less than the given second lower limit potential. The first limit potential is typically more positive than or equal to the potential at the supply potential terminal 18, while the second limit potential is typically more negative than or equal to the potential at the reference potential terminal 16. The control circuit 26 is therefore designed so that it puts the semiconductor switch 20 into an opened condition by corresponding driving, when the potential at the output node 14 is higher than the first limit potential or when the potential at the output node 14 is lower than the second limit potential. The control circuit 26 is designed to derive the first and second limit potentials from the supply potential at the supply potential terminal 18 and the reference potential at the reference potential terminal 16. Furthermore, the control circuit 26 is designed to supply a control signal 24 putting the semiconductor switch 20 into a closed condition to the semiconductor switch 20 at the control terminal 22, when the potential at the output node 14 is between the first limit potential and the second limit potential.

Furthermore, it is to be noted that the semiconductor switch 20 comprises only three terminals. Two terminals are associated with a switched path connected between the input node 12 and the output node 14. The semiconductor switch 20 further comprises a control terminal 22. The effect of the control signal 24 at the control terminal 22 is thus determined by the potential at the control terminal 22 with respect to the potentials at the other two terminals of the semiconductor switch 20 associated with the switched path. Which one of the two latter potentials is substantially decisive for the switching condition of the semiconductor switch 20 depends on the type of the semiconductor switch 20 and on the operating condition of the semiconductor switch 20. Thus the difficulty arises that the control circuit 26 has to output a control signal 24 to the semiconductor switch 20 which depends on the potentials at the input node 12 and the output node 14 and also depends on the operating condition of the semiconductor switch 20. In order to obtain an improved switching effect, it is possible that the control circuit 26 influences the potential at the input node 12 via an influencing means 34. This allows a more efficient and more reliable opening and/or closing of the semiconductor switch 20.

Figure 2:
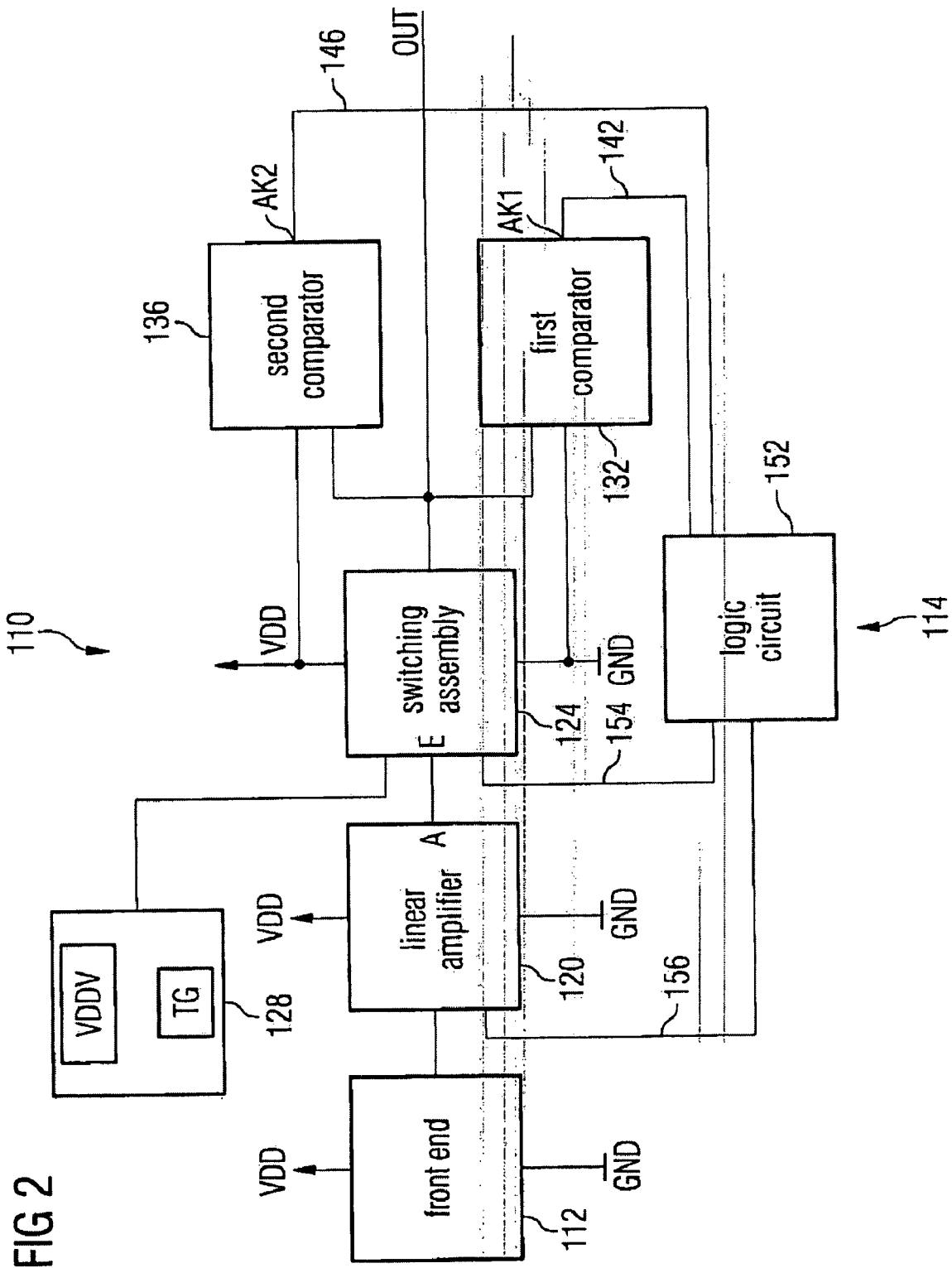
FIG. 2 is a detailed block circuit diagram of an inventive output circuit according to a second embodiment of the present invention.

FIG. 2 shows a detailed block circuit diagram of a circuitry having an inventive output circuit according to a second embodiment of the present invention. The circuitry is designated 110 in its entirety. The circuitry 110 includes a front end 112 of an integrated circuit and an output circuit 114. In the signal path between the front end 112 of the integrated circuit and the output terminal OUT, the output circuit 114 includes a linear amplifier 120 and a switching assembly 124 which puts the output terminal into a well-defined condition in the case of an interruption of a supply potential feed for the reference potential GND or the positive supply potential VDD and which disconnects the output terminal OUT from the connected circuit components, particularly from the linear amplifier 120, in the case of a polarity inversion or an overvoltage. A number of auxiliary circuits are necessary for the operation of the switching assembly 124. As the switching assembly 124 normally includes charge pumps, a circuitry 128 is necessary which generates a reference potential VDDV and a clock signal for the charge pumps of the switching assembly 124 and supplies them to the switching assembly 124.

The output circuit further includes two comparators 132, 136. The first comparator 132 receives a signal from the output terminal OUT and compares it to the reference potential GND or a lower limit potential derived therefrom. If the first comparator 132 discovers that there is a polarity inversion of the output signal, i.e. that the potential at the output terminal OUT is more negative than the reference potential GND by a given amount, it generates a corresponding polarity inversion signal 142. Similarly, the second comparator 136 receives the signal from the output terminal OUT and the positive supply potential VDD. If an overvoltage is applied to the output terminal OUT, which is characterized by the potential at the output terminal OUT being larger than the positive reference potential VDD by a given amount, the second comparator circuit 136 outputs an overvoltage signal 146.

The polarity inversion signal 142 and the overvoltage signal 146 are supplied to a logic circuit 152. The latter is designed to output control signals 154, 156 to the switching assembly 124 and to the linear amplifier 120 to cause a disconnection of the output terminal OUT from the signal path coupled thereto in the case of an overvoltage or a polarity inversion. Furthermore it should be mentioned that the front end 112 of the integrated circuit and the linear amplifier 120 are supplied with the reference potential GND and the positive supply potential VDD.

The circuitry 110 is thus able to cause a well-defined operating condition and to avoid damage to components both in the case of an interruption of a supply potential feed and in the case of a polarity inversion or an overvoltage at the output terminal OUT. On the one hand, this is guaranteed by the design of the switching assembly 124, which pulls the output to the respective other supply potential by normally-on structures in the case of an interruption of a supply potential feed. A polarity inversion condition or an overvoltage condition at the output terminal OUT is detected with comparators 132, 136 and evaluated via a logic circuit 152. In a disturbance case, there will be an active control intervention at the linear amplifier 120 and/or the switching assembly 124. The circuitry 128 for generating a reference voltage VDDV and a clock signal serves as auxiliary circuit for the switching assembly 124. However, it may also be integrated within the same.

Significant changes to the circuitry are possible without departing from the main idea of the invention. For example, various supply and reference potentials may be used for various circuitry parts. The front end 112 of the integrated circuit and the linear amplifier may be supplied with separate supply potentials. It is further possible to define the switching thresholds for polarity inversion and overvoltage differently from what was described above. The only precondition is that the potential of the switching threshold for an overvoltage is higher than the potential of the switching threshold for a polarity inversion. Furthermore it is useful when the two switching thresholds are dependent on the supply potential and the reference potential. Furthermore, it is not necessarily required to use an additional logic circuit 152. The logic may instead be contained in the comparators 132, 136 or also in the switching assembly 124. In addition, it is not necessarily required that there is a reverse influence on the linear amplifier 120 from the comparators 132, 136 via a logic circuit 152. It may be omitted when the switching assembly 124 is correspondingly designed to achieve a disconnection of output terminal OUT and the amplifier output A independent of the condition of the amplifier output A.

Furthermore it is to be noted that the amplifier output A of the linear amplifier 120 is intercoupled with the input E of the switching assembly 124. The switching assembly 124 is also referred to as OBD circuit (open bond circuit). It is important to note that the supply voltage terminals for the positive supply potential VDD and the reference potential GND and the terminal for the output signal applied to the circuit output OUT are bonded in a typical system design. It is exactly this implementation that makes the usage of an OBD circuit as switching assembly 124 necessary and useful. In that way, interrupted bond wires may be detected. However, the application of an inventive circuitry is not limited to such cases in which bond connections are used. Instead, the circuitry may be usefully employed whenever there are connection lines which run the risk to be interrupted or short-circuited with respect to other potentials.

Furthermore, an example of a quantitative design of an inventive circuitry 110 is to be represented here. The circuitry 128 serving as auxiliary circuit may, for example, be designed to provide a constant voltage VDDV which is about 1.5 times the pinch-off voltage Up of a p-channel junction field effect transistor (pJFETs) used in the switching assembly 124: VDDV=1.5*Up. Such a design is useful because the p-channel junction field effect transistor blocks the current flow through its channel between source and drain, when a potential is applied to its gate that is larger than a potential at its source terminal by the pinch-off voltage Up. In the present embodiment, the first comparator 132 is designed so that it outputs a signal having a high logic value (HIGH signal) at its output, when the potential at the output terminal OUT becomes sufficiently negative. In the present embodiment, the first comparator 132 is selected so that its output signal assumes a high logic level when the voltage at the output terminal OUT is smaller than −1 V (with respect to the reference potential GND). In other words, the logic function of the comparator may be described as AK1=(OUT<−1 V), wherein AK1 is the logic value of the output signal of the first comparator 132.

In the present embodiment, the second comparator 136 is designed so that a signal with a high logic value (HIGH signal) is output at its output, designated AK2, when the potential at the output terminal OUT is larger than the positive supply potential VDD by a sufficient amount. For example, a design is favorable in which the second comparator 136 outputs a high logic signal at its output AK2 when the potential at the output terminal OUT is above the positive supply potential VDD by at least 0.7 V. Mathematically this may be expressed as follows: AK2=(OUT>VDD+0.7 V). A clock generator TG contained in the circuitry 128 is conveniently designed to output a high-frequency square-wave signal at a frequency in a range between about 1 MHz and 10 MHz. This signal serves for driving the charge pumps preferably contained in the switching assembly 124 (OBD circuit).

A main idea of the invention is thus the selection of appropriate circuit elements and the design of appropriate driving, wherein the combination of the means ensures that the circuitry may react to all demands occurring in practice without the circuit being destroyed.

Figure 3:
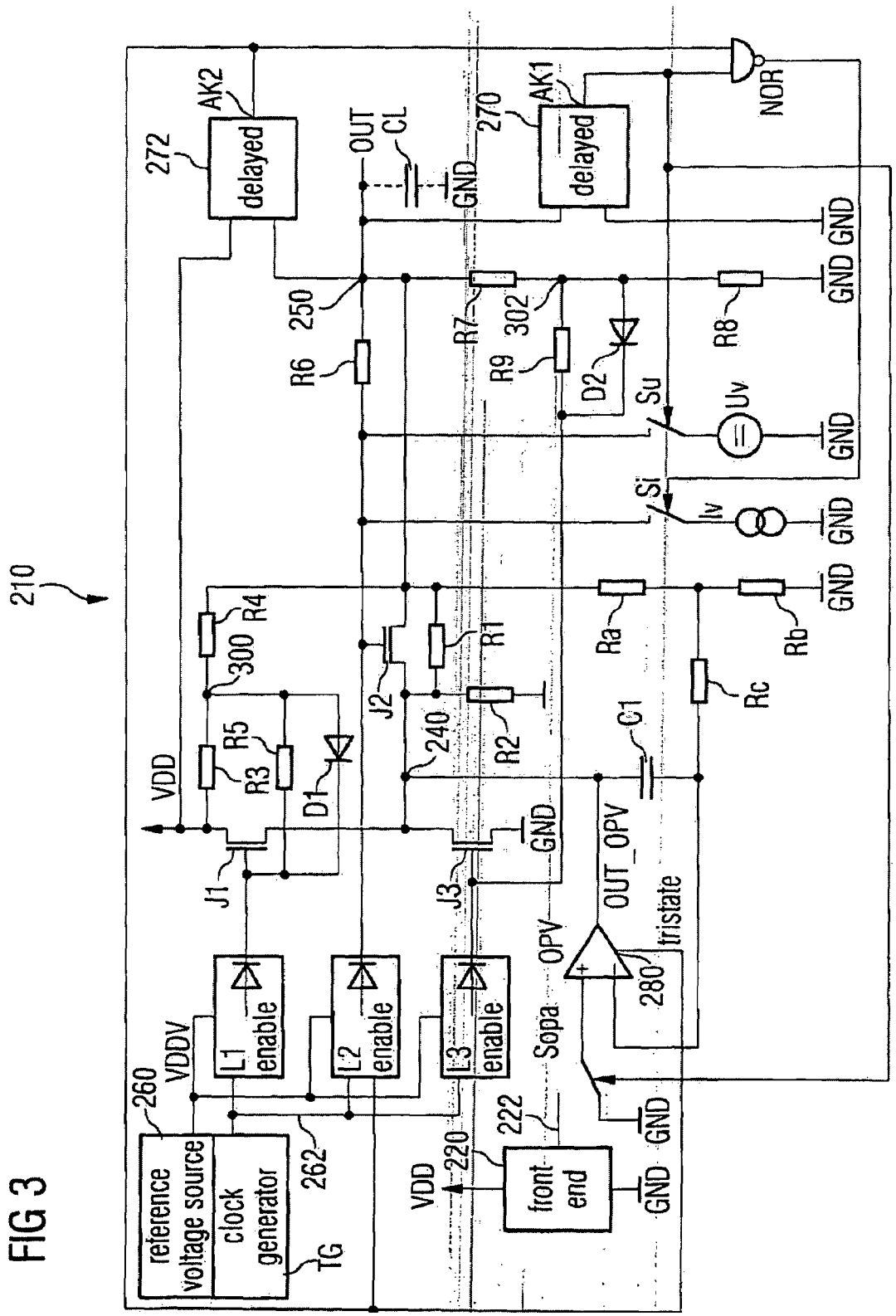
FIG. 3 is a circuit diagram of an inventive output circuit according to a third embodiment of the present invention.

FIG. 3 shows a circuit diagram of an inventive output circuit according to a third embodiment of the present invention. The output circuit is designated 210 in its entirety. What is shown here is the front end 220 of an integrated circuit supplying a signal 222. The front end 220 of the integrated circuit is supplied with a supply potential VDD and is also coupled to the reference potential GND.

The signal path through the output circuit 210 further includes an operational amplifier OPV. The signal 222 may be applied to the non-inverting input of the operational amplifier via a switching means Sopa. It is also possible to apply the reference potential GND to the non-inverting input of the operational amplifier via the switching means Sopa. The output of the operational amplifier is coupled to a first signal node 240. In a regular operating condition, the potential of the first signal node 240 is essentially determined by the output of the operational amplifier OPV. The first signal node 240 is connected to a second signal node 250 via the drain source path of a field effect transistor J2. The second signal node 250 is further connected to the output terminal OUT. The described elements thus represent the signal path with a regular operation of the circuitry 210.

The output circuit 210 further includes a circuit for detecting interruptions on the supply potential feed and the reference potential feed. Therefore the first signal node 240 is connected to the positive supply potential VDD via the drain source path of a field effect transistor J1. The first signal node 240 is also connected to the reference potential GND via the drain source path of a field effect transistor J3. The gate terminals of the field effect transistors J1 and J3 are driven via charge pump circuits L1, L3. The charge pump circuits L1, L3 obtain a reference voltage VDDV from a reference voltage source 260 and a clock signal 262 from a clock generator TG.

The output circuit 210 further includes means protecting the output circuit itself and further circuitries connected thereto from destruction, if an overvoltage or an inverted polarity voltage is applied to the output terminal OUT. Therefore the output circuit 210 includes a first comparator circuit 270 connected to the reference potential GND and to the second signal node 250 to which the output signal at the output terminal OUT is applied. At an output AK1, a signal is applied which is formed by the first comparator 270 depending on the potential at the second signal node 250. Furthermore the output circuit 210 includes a second comparator 272 connected to the second signal node 250 and the positive supply potential VDD. At the output AK2 of the second comparator 272, a signal is applied which, in turn, depends on the potential at the output terminal OUT and/or the second signal node 250. The signals at the outputs AK1, AK2 of the first and second comparators 270, 272 each tell whether an overvoltage or an inverted polarity signal is applied to the output terminal OUT and/or the second signal node 250.

Furthermore there is a variety of means to influence the signal path in the case of an overvoltage or a polarity inversion. The output AK2 of the second comparator 272 drives a charge pump circuit L2 at an enable input. Besides, the charge pump circuit L2 obtains a reference voltage VDDV from the reference voltage source 260 and a clock signal 262 from the clock generator TG. The output of the charge pump L2 is connected to the gate terminal of the second field effect transistor J2, which is connected between the first signal node 240 and the second signal node 250 with respect to its drain source path. Furthermore, the output signal AK2 of the second comparator 272 is connected to a control input 280 of the operational amplifier OPV. The operational amplifier OPV is designed so that its output may be switched to a high-ohmic condition (tri-state condition) by a signal applied to the control input 280. The gate terminal of the second field effect transistor J2 is further connected to a current source Iv via a switch Si. The current source Iv is connected to the reference potential GND with its bottom end terminal. Furthermore, the gate terminal of the second field effect transistor J2 is connected, via a switching means Su, to a voltage source circuit Uv whose bottom end is again coupled to the reference potential GND. If the output AK1 of the first comparator circuit is active, the switch Su is closed and thus the gate of the field effect transistor J2 is set to a potential given by the voltage source circuit Uv with respect to the reference potential. The output AK1 of the first comparator circuit 270 is further coupled to the control input of the switch Sopa at the input of the operational amplifier OPV. If the signal at the output AK1 of the first comparator circuit is active, the non-inverting input of the operational amplifier OPV is connected to the reference potential GND, while it is otherwise coupled to a signal 222 of the front end 220 of an integrated circuit.

If neither at the output AK1 of the first comparator circuit 270 nor at the output AK2 of the second comparator circuit 272 an active signal is applied, the switch Si is closed. This is because the control input of the switch Si is connected to the outputs AK1 and AK2 of the first and second comparators 270, 272 via a NOR operation. Thus the gate of the field effect transistor J2 is discharged with a current predetermined by a current source Iv until it is on a balance potential.

Furthermore, discharge circuits are provided for the gate terminals of all three field effect transistors J1, J2, J3. The gate terminal of the second field effect transistor J2 is connected to the second signal node 250 via a high-ohmic resistor R6. The second signal node 250 is connected to the output terminal OUT of the output circuit 210. The discharge circuits for the gates of the first and third field effect transistors J1, J3 are constructed in a more complicated way. The gate terminal of the first field effect transistor J1 is discharged towards a first discharge node 300, wherein the discharge node 300 is the center node of a voltage divider circuit consisting of two resistors R3, R4 connected between the positive supply potential VDD and the second signal node 250. The gate terminal of the first field effect transistor J1 is connected to the first discharge node 300 via a high-ohmic resistor R5. Furthermore, a first diode D1 whose anode is located on the side of the first discharge node 300 is connected between the first discharge node 300 and the gate terminal of the first field effect transistor J1. A similar discharge circuit is also provided for the gate terminal of the third field effect transistor J3. A second discharge node 302 is at the center node of a voltage divider which is formed of two resistors R7, R8 which is between the second signal node 250 and the reference potential GND. The gate terminal of the third field effect transistor J3 is connected to the second discharge node 302 via a high-ohmic resistor R3 and a second diode D2 connected in parallel. The anode of the second diode D2 is on the side of the discharge node 302.

The output circuit 210 further includes means which may achieve a frequency compensation and an improvement of the stability of the operational amplifier OPV. It is assumed that a capacitive load CL is applied to the output terminal OUT which significantly influences the behavior of the overall circuit. In this modeling, the capacitive load CL is connected between the output terminal OUT and the reference potential GND. A compensation of this capacitive load is done by an appropriate feedback from the output of the operational amplifier to the input of the operational amplifier. Thus a feedback capacitance C1 is connected between the output of the operational amplifier OPV and its inverting input. Furthermore, there is a feedback between the second signal node 250 and the inverting input of the operational amplifier OPV. Here, two resistors Ra, Rb are connected between the second signal node 250 and the reference potential to operate as resistive voltage divider network. The central tap of this resistive voltage divider network between the resistors Ra and Rb is connected to the inverting input of the operational amplifier OPV via a further resistor Rc.

Furthermore it is to be noted that a resistor R1 is connected in parallel to the drain source path of the second field effect transistor J2. In addition, a resistor R2 is connected between the first signal node 240 and the reference potential GND.

Based on the structural description, further details and the operation of the output circuit 210 described above will be explained in more detail in the following. What is decisive for the operation is, among other things, that appropriate field effect transistors J1, J2, J3 are employed. In the present embodiment, the first field effect transistor J1 is a p-channel junction field effect transistor connected between the positive supply potential VDD and the first signal node 240. The second field effect transistor J2 is also a p-channel junction field effect transistor (pJFET) in the present embodiment. It is connected into the signal path between the first signal node 240 and the second signal node 250 which is eventually connected to the output terminal OUT. The third field effect transistor J3 is also a p-channel junction field effect transistor. It is connected between the first signal node 240 and the reference potential GND. What is important for the function of the inventive circuit is that the field effect transistors, particularly the first field effect transistor J1 and the third field effect transistor J3, are normally-on devices, i.e. field effect transistors of the depletion type (depletion FET).

The first charge pump L1 driven by the clock generator TG and supplied with a reference voltage VDDV pumps the gate terminal of the first field effect transistor J1 (first pJFET) ideally to a potential of VDD+VDDV. The potential at the gate terminal of the first field effect transistor should thus ideally be above the positive supply potential VDD by the reference voltage VDDV. However, as the charge pump L1 is dissipative in practice, the gate terminal of the first field effect transistor J1 will only be charged to a potential that is more negative than VDD+VDDV. However, it is sufficient to charge the gate terminal of the first field effect transistor J1 to VDD+Up. VDD is the positive supply potential, Up is the pinch-off voltage of the first field effect transistor by amount. For this reason, the reference voltage VDDV is selected larger than the pinch-off voltage Up of the field effect transistor, for example as VDDV=Up*1.5. For such a selection, the losses of the charge pump may then maximally be 0.33*VDDV to keep the gate potential of the first field effect transistor J1 reliably above the positive supply potential VDD by at least the pinch-off voltage Up. If, however, the gate potential is above the positive supply potential VDD by at least the pinch-off voltage, the channel of the first field effect transistor J1 is pinched off and no current can flow through the same. This is desired because the first field effect transistor J1 is to block if the positive supply potential VDD and the reference potential GND are applied properly and if thus the first charge pump L1 properly raises the gate potential of the first field effect transistor. If the first charge pump fails, because either the positive supply potential VDD or the reference potential GND are interrupted, there is no longer any guarantee that the gate potential of the first field effect transistor J1 is above the supply potential VDD. As the transistor is of a normally-on type, it becomes conductive in this case, and a potential close to the supply potential VDD is output at the output terminal OUT.

Similarly, the third charge pump L3 is driven by the clock signal 262 of the clock generator TG and pumps the gate terminal of the third field effect transistor J3, which is a p-channel junction field effect transistor in this embodiment, to a potential of at least the potential of the first signal node 240 plus the reference voltage VDDV. Of course, also here losses of the charge pump have to be considered, as described above, so that the potential at the gate terminal of the third field effect transistor J3 is a little lower in a real circuit implementation. However, this is tolerable as long as there is a guarantee that the third field effect transistor J3 blocks until the positive supply potential VDD and the reference potential GND are properly applied.

The two field effect transistors J1 and J3 are responsible for setting the output terminal OUT to a well-defined potential, if the supply potential VDD and/or the reference potential GND is interrupted due to a defect in the external connection of the output circuit. This may be the case, for example, by a cable break or also by the interruption of an on-chip bond connection.

In the following, there will be described the driving of the gate terminal of the second field effect transistor J2 which is essentially responsible for the protection against overvoltage or polarity inversion. If the potential at the output terminal is more positive than the supply potential VDD by more than 0.7 V (i.e. for OUT>VDD+0.7 V), then the output AK2 is active (i.e. HIGH). In this case, the second charge pump L2 is active and, driven by the clock signal 262 of the clock generator TG and supplied by the reference voltage VDDV, pumps the gate of the second field effect transistor J2, which is a p-channel junction field effect transistor, to a potential which is above the potential of the output terminal OUT ideally by the reference voltage VDDV, but at least by the pinch-off voltage Up. In other words, if OUT does no longer only refer to the output terminal, but analogously also to the potential at the output terminal, the gate of the second p-channel junction field effect transistor J2 is at OUT+VDDV. In the condition that the potential at the output terminal OUT is above the positive supply potential VDD by more than 0.7 V, the linear amplifier is switched to a condition in which its output is as high-ohmic as possible. This is referred to as a tri-state condition. In this way, the circuitry is protected from overvoltage at the output terminal OUT. This is because the channel of the second field effect transistor J2 is pinched off by the gate potential, which is above the potential at the output terminal OUT by the reference voltage VDDV, but at least by the pinch-off voltage Up. Thus a current flow is eliminated and/or minimized.

If the potential at the output terminal OUT is below the reference potential GND by less than 1 V and simultaneously above the positive supply potential VDD by less than 0.7 V, i.e. for −1 V<OUT<VDD+0.7 V, low logic levels are applied to the outputs AK1 and AK2 of the first comparator circuit 270 and the second comparator circuit 272. The outputs of the two comparator circuits are thus inactive. In other words, this means that the potential at the output terminal OUT is within a tolerable range extending from a level 1 V below the reference potential to a level about 1.7 V above the positive supply potential VDD. In this case, the second charge pump L2 does not operate and does not raise the potential at the gate terminal of the second field effect transistor J2. Instead, the output of the NOR operation is active (HIGH), so that the gate terminal of the second field effect transistor J2 is coupled to the current source Iv via the switch Si.

Thus, if the second charge pump L2 does not operate and the gate terminal of the second p-channel junction field effect transistor is pulled to a low potential by the current source Iv, the second p-channel junction field effect transistor J2 is well-conducting. Here, its ON-resistance in the order of 50 ohm is profitably used for decoupling the output of the linear amplifier from a capacitive load CL typically connected to the output terminal OUT of the output circuit 210. This is advantageous because the capacitive load CL may be very large in some applications, i.e. in the order of 250 nF. The ON-resistance of the second field effect transistor is used as part of a particularly advantageous lead-lag frequency combination. This frequency combination will be described in more detail below. Here, it is only to be noted that, in the condition in which the potential at the output terminal OUT is within the mentioned allowable interval, the linear amplifier OPV is turned on, so that it outputs a voltage at the first signal node 240 passed on to the second signal node and thus also to the output terminal OUT. Thus, in the case that the potential at the output terminal is within the allowable interval, the output circuit fulfills the intended function to pass on a signal from the front end 220 of the integrated circuit to the output terminal OUT via the linear amplifier OPV and the second field effect transistor J2. The overvoltage protection and the polarity inversion protection are inactive. The first and the third field effect transistors J1, J3 are pinched off and do not influence the signal path either.

If the potential at the output terminal OUT is more negative than the reference potential by more than 1 V (i.e. OUT<−1

V), the output AK1 of the first comparator circuit 270 is active, i.e. HIGH. In this case, the gate terminal of the second field effect transistor is coupled to the voltage source Uv via the switch Su, which is now closed. Via the voltage source Uv, the gate terminal is set to a voltage which is at least equal to the pinch-off voltage Up. The source node of the second field effect transistor J2, which is connected to the first signal node 240, is pulled to 0 V, i.e. to reference potential, by the linear amplifier OPV. This is achieved by connecting the non-inverting input of the linear amplifier OPV to the reference potential via the switch Sopa. Thus, in this condition, the channel of the second p-channel junction field effect transistor is pinched off and no current and/or only a negligibly small current flows into the output terminal OUT (OUT pin). In this way, the output terminal OUT is protected against polarity inversion.

A further part of the present output circuit 210 are discharge circuits for the gate terminals of the three field effect transistors J1, J2, J3. The discharge circuits have the task to discharge the gates of the field effect transistors J1, J2, J3, when the charge pumps L1, L2, L3 are turned off, i.e. particularly in the case that one of the supply lines is interrupted, and thus to make the p-channel junction field effect transistors J1, J2, J3 conductive with sufficient speed. This should be done within a time period in the order of 10 µs. Therefore it is possible in an extreme case that the leakage current of the gates does this discharging. However, in this case, the discharge is mostly too slow at low temperatures (for example at −40° C.) in practice.

A particularly advantageous form of a discharge circuit by resistors is shown in the output circuit 210 (in FIG. 3). The discharge resistors R5, R6, R9 which are mostly extremely high-ohmic, which typically have a size of several megaohm, are not coupled, as it is usual, to a fixed potential, such as the reference potential GND or the positive supply potential VDD. Instead, the discharge resistor R6 for the gate of the second junction field effect transistor J2 is connected between the gate terminal of the second field effect transistor J2 and the output terminal OUT. The discharge resistor R5 of the first p-channel junction field effect transistor J1 connects the gate terminal of the transistor to the center terminal 300 of a voltage divider consisting of the resistors R3 and R4 which is connected between the output terminal OUT and the positive supply potential VDD. The discharge resistor R9 for the gate of the third p-channel junction field effect transistor J3 is coupled to the center terminal 302 of a voltage divider consisting of the resistors R7 and R8, wherein the voltage divider is connected between the output terminal OUT and the reference potential GND. In the following, the design of the voltage divider of the discharge circuit for the first field effect transistor J1 will be explained in more detail. However, the considerations may be translated analogously to the discharge circuit for the gate of the third field effect transistor J3. The combination of the resistors R3 and R4 is selected so that the gate terminal of the first p-channel junction field effect transistor is pulled to a potential which is above the average value of the positive supply potential and the potential at the output terminal OUT by about a pinch-off voltage, by the voltage divider, in the case of a short circuit of the output terminal OUT (OUT pin) towards high voltages. Therefore the following applies:

$$VDD+(OUT-VDD)*R3/(R3+R4)=(VDD+OUT)/2+|Up| \quad (1)$$

From this, the relation of the resistors R3 and R4 may be determined by transformation as follows:

$$R4/R3=(OUT-VDD-2*|Up|)/(OUT-VDD+2*|Up|) \quad (2)$$

Here, OUT represents the maximum allowable overvoltage at the output terminal OUT and VDD represents the minimum allowable operating voltage VDD. This represents the worst case. An inventive design of the discharge circuit causes a division of a high overvoltage at the output terminal OUT between the channels of the first and second p-channel junction field effect transistors J1, J2. This allows to block extremely high voltages by the shown output circuit 210, before the junction field effect transistors J1, J2 break down and pull a high current, wherein they can then destroy the integrated circuit by their power dissipation.

As a short circuit at the output terminal OUT mostly means a fast voltage ramp in the order of 1 µs at the terminal (pin), a diode D1 is connected in parallel to the high-ohmic discharge resistor R5 at the gate terminal of the first junction field effect transistor J1 to achieve a good distribution of the (over-) voltage at the output terminal OUT to the first and second junction field effect transistors J1, J2 even in a transient case. Here, the diode D1 fulfills the task of charge-reversing a gate capacitance of the first field effect transistor J1 faster than this is possible via the high-ohmic discharge resistor R5 whose value is in the megaohm range. The diode D1 must, of course, block for the case that the gate terminal of the first p-channel junction field effect transistor J1 is pumped high by the charge pump L1. Thus the cathode of the diode D1 has to be applied to the gate terminal of the first junction field effect transistor J1.

Analogous considerations apply to the connection of the third junction field effect transistor J3 to a discharge resistor R9, a diode D2 and a voltage divider network consisting of the resistors R7 and R8.

Furthermore, the output circuit 210 includes a circuitry for improving the phase margin of the linear operational amplifier OPV when there is a large capacitive load CL connected between the output terminal OUT of the output circuit 210 and the reference potential GND. Such a frequency response compensation, also referred to as "lead-lag compensation", is known for example from the book "Halbleiter-Schaltungstechnik" by U. Tietze and Ch. Schenk, Springer Verlag, 9$^{th}$ edition 1989, p. 154, FIG. 7.33. In an inventive output circuit 210, the second junction field effect transistor J2 assumes the task of a decoupling resistor decoupling the output of the operational amplifier OPV from the positive electrode of the load capacitance CL. Instead of a conventional inverting feedback, the inventive output circuit 210 uses a non-inverting feedback. The resistors Ra and Rb serve for this purpose. The capacitance C1 of the inventive output circuit 210 represents the lead compensation capacitance. As in integrated circuit technology, unlike in discretely constructed circuits, no large capacitances can be realized, the time constant of the lead compensation is reduced by the additional resistor Rc. For example, for a maximum capacitive load CL of 250 nF, the time constant, which is calculated as the product of C1 and Rc (C1*Rc), must be about 50 µs. The inventive output circuit 210 thus uses the actually disturbing ON-resistance of the junction field effect transistor J2 advantageously to achieve a lead compensation. Thus it is no longer necessary to realize a decoupling resistor on the integrated circuit. This is a considerable advantage because resistors require particularly much area on bond pads to be able to drain the power dissipation sufficiently well into the substrate in the case of an electrostatic discharge (ESD case).

The inventive output circuit 210 is further designed so that it has a sufficiently good disturbance resistance with respect to electromagnetic launches. This is achieved by the output AK2 of the second comparator circuit 272 only becoming active (HIGH) when a potential is applied to the output terminal OUT which is more positive than the positive supply potential VDD by a sufficiently large amount. Similarly, the first comparator circuit 270 is designed so that the output AK1 only becomes active when the potential at the output terminal OUT is more negative than the reference potential GND by a sufficiently large amount. The reason for such a design of the first and second comparators 270, 272 is that the EMV resistance (electromagnetic compatibility) of the system can be improved by this measure. During operation of the output circuit 210 and/or a system including an output circuit 210, disturbances on the positive supply potential VDD, on the reference potential GND and at the output terminal OUT and/or on the potential OUT applied thereto have to be expected. They are caused by disturbing irradiation of external systems onto the long lines via which these potentials are transferred and/or which are connected to the respective terminals suitable for feeding the potentials. If the integrated circuit (IC) outputs an output voltage close to the reference potential GND, the potential at the output terminal OUT may be pulled below the reference potential GND for a short time by a negative disturbance peak at the output terminal OUT. Also, in an operating condition in which the signal at the output terminal OUT is close to the positive supply potential VDD, a short-term positive disturbance peak may pull the potential at the output terminal OUT above the positive supply potential VDD for a short time. In both cases, it is advantageous that the p-channel junction field effect transistors J1 and J3 remain pinched off (blocking), while J2 remains conducting. In other words, the system and/or the output circuit 210 should not treat these cases like polarity inversion or overvoltage cases. Namely, in normal operation (i.e. for example for −1V<OUT<VDD+0.7V), the field effect transistors J1 and J3 are blocking, while J2 is then conducting. For short voltage peaks at OUT which leave this range (−1V<OUT<VDD+0.7V), J1 and J3 should remain blocking and J2 should remain conducting for a disturbance-free function.

In order to avoid that smaller disturbances at the output terminal OUT and/or on the supply potential feeds for VDD and GND result in malfunctions, the decision thresholds of the first and second comparators 270, 272 are set to −1V and/or VDD+0.7 V (with respect to the reference potential GND) in an inventive output circuit. This already achieves a certain disturbance safety. If, however, a real polarity inversion case and/or overvoltage case occurs, the system reacts only when these thresholds are exceeded and only pinches off the second junction field effect transistor J2 in strong polarity inversion and overvoltage cases. This is allowable because, in small polarity inversion and overvoltage cases, only moderate currents will flow. For example, assume that the second junction field effect transistor J2 has an ON-resistance Rds, on of 50 ohm, and that the decision threshold of the first comparator 270 (which is responsible for a polarity inversion) is at −1 V. With these assumptions, a current of about 20 mA flows in a light polarity inversion case in which the potential at the output terminal OUT is more negative than the reference potential by 0.99 V (OUT=−0.99 V). This does not destroy the integrated circuit (IC). For stronger polarity inversion cases, i.e. when the voltage at the output terminal OUT becomes more negative, the output AK1 of the first comparator circuit 270 becomes active (HIGH) and acts so that the second junction field effect transistor J2 is pinched off. Thereupon the current flow ceases.

As a further measure for improving the electromagnetic compatibility, i.e. to improve the insensitivity with respect to short disturbing impulses, a time delay may be installed in the comparators 270, 272. With such a solution, the output of a comparator 270, 272 only responds to exceeding and/or dropping below a switching threshold with a time delay of about 0.1 µs to 10 µs. In other words, exceeding and/or dropping below a threshold for a time shorter than the delay time does not have any effect on the outputs AK1, AK2 of the comparator circuits 270, 272. Thus, if a high frequency disturbing impulse switches a comparator 270, 272 active, (HIGH), for a short time, this active signal (HIGH) is only passed on to a comparator output AK1, AK2, if it is applied for a sufficiently long time. If a real polarity inversion case occurs, the system correspondingly also reacts with the predetermined time delay. However, this is allowable when the delay is sufficiently smaller than the thermal time constant of the integrated circuit, because then the integrated circuit (IC) cannot heat up until being destroyed during this short polarity inversion in spite of a strong current flow. Of course, for this all devices have to have sufficient electric strength so that they do not become defective only due to the high voltage. For example, no sensitive dielectric may be exposed to the high polarity inversion voltage. Also, the lines have to be sufficiently thick to be able to carry the current, even if only for a short time. In order to achieve this, the electromigration rules have to be considered in the design, for example.

The inventive output circuit 210 may be further improved, if necessary. In order to increase the electric strength of an inventive output circuit, several p-channel junction field effect transistors may be connected in series and all additional gate terminals may be put to suitable intermediate potentials only by resistive voltage dividers, as described above for the junction field effect transistors J1 and J3, so that there is a division into smaller partial voltages for high voltages. Only the junction field effect transistor at the terminal (pin) to which the overvoltage is applied (OUT or VDD) has to be actively pinched off by means of a charge pump. The gate terminals of all other junction field effect transistors of this series connection may be driven by voltage dividers. If the voltage at a terminal (pin) becomes larger than the breakdown voltage of a junction field effect transistor between drain and source, it breaks down and in doing so functions similarly to a Zener diode, so that the difference between applied voltage and breakdown voltage is passed through to the other junction field effect transistors.

If it is desired to prevent a breakdown of the pumped junction field effect transistor, it is possible to connect a high-ohmic resistor (advantageously of poly high-ohmic resistor material) in parallel to its channel. It conducts only a few microamperes and does not significantly disturb the operation of the circuit in normal operation. In the case of an overvoltage, however, the few microamperes are sufficient to define its drain source potential in the pinched-off condition and, by a suitable series connection with further junction field effect transistors and their voltage dividers, keep it so small that a breakdown is avoided. Instead of a p-channel junction field effect transistor (pJFET), there may also be used a p-channel MOS-field effect transistor of the depletion type (depletion P-MOSFET).

There is large freedom in the selection of the transistor type as long as it is guaranteed that a transistor has sufficient polarity inversion resistance and sufficient electric strength. For example, instead of p-channel junction field effect transistors (pJFETs), there may also be used n-channel junction field effect transistors (nJFETs) or n-channel MOS-field effect transistors of the depletion type (depletion nMOS-FETs). However, the latter transistors are not polarity inversion resistant with conventional p-substrate. This means that, when applying a potential negative with respect to the substrate at their source terminal, a parasitic diode is opened.

Such devices allow a maximum polarity inversion voltage of −0.3 V. p-channel junction field effect transistors, however, allow −16 V of polarity inversion. In p-channel MOS-field effect transistors of the depletion type (depletion P-MOS-FET), the substrate source diode (bulk source diode) also opens in the case of polarity inversion. This may be repaired by making the substrate (bulk) high-ohmic by suitable layout measures. This, however, increases the risk of latch up.

Further it is to be noted, however, that a circuitry may, of course, also be realized in a complementary way to the shown output circuit. If the substrate is of the n-conducting type, correspondingly transistors of the opposite type as compared to the case for p-conducting substrate are respectively polarity inversion resistant.

An inventive circuitry may thus, in principle, be realized with any type of normally-on semiconductor switch, wherein normally-on field effect transistors of the n-channel and p-channel types may be used most advantageously. For this it is unimportant whether they are junction field effect transistors or MOS-field effect transistors. It is to be noted that, in the case of n-type normally-on transistors, a potential has to be applied to the gate for pinching off which is negative with respect to the potential at the source terminal by the amount of the pinch-off voltage |Up|. It may be that the potential at the gate of a normally-on transistor of the n-type has to be negative with respect to the reference potential GND (ground). However, with known charge pump circuits, this is no fundamental problem.

FIG. 4 shows a time representation of currents and voltages in an inventive output circuit for an exemplary excitation. FIG. 4 shows a first time representation of currents designated 410. Here, time is represented at the abscissa 412, wherein a range from 0 to 200 μs is shown. The ordinate shows a current in a value range of +/−30 mA and is designated 414. Furthermore, there is shown a time representation of voltages designated 420. Again the time from 0 to 200 μs is plotted on the abscissa 422. The ordinate shows voltages between −10 V and +30 V with respect to the reference potential GND and is designated 424.

The first time representation 410 shows a first curve 430 representing the current at the output terminal OUT of the output circuit. Furthermore, the first time representation 410 shows a second curve 434 representing the current IDD through a terminal for the supply potential VDD. The current IDD is merely identical to the current through the first field effect transistor J1, because the current through the first field effect transistor J1 is much larger than the current through the third resistor R3 or through the front end 220 of an integrated circuit.

The second time representation 420 shows a first curve 440 representing the progress in time of the positive supply voltage VDD. Furthermore, a second curve 444 is shown representing the output voltage OUT at the output terminal of the output circuit. Furthermore, a third curve 448 shows the output voltage of the operational amplifier OPV applied to the first signal node 240. What is further shown is the voltage at the gate terminal of the first junction field effect transistor J1 in a curve 452, and the voltage at the gate terminal of the second junction field effect transistor J2 in a curve 456.

All curves are the result of a simulation in which the positive supply voltage VDD is first started up from 0 V to 5 V, and in which there is further applied a voltage at the output terminal OUT which goes up from −6 V to +24 V. The corresponding change in the positive supply voltage VDD can be seen in the curve 440, while the change in the output voltage OUT is shown in the curve 444. What can be seen in the range between about 0 and 5 μs, is a large current flow of about −30 mA. At that time, the voltage at the gate terminal of the second field effect transistor J2 is still approximately equal to 0, because the system has not been started up yet. Therefore, a large output current I_OUT=30 mA is flowing. Once the system is started up (i.e. from about the time 5 μs), and if the voltage at the output terminal OUT is negative, the gate potential of the second junction field effect transistor J2 (with respect to the reference potential) is set to about +3 V. (See curve 456, time range about 5 μs to 35 μs). The output of the operational amplifier (OUT_OPV) represented in the curve 448 is set to 0 V. The second field effect transistor J2 is thus pinched off. The output current I_OUT approximately equals 0 in the time range between about 5 μs and 35 μs. If the voltage at the output terminal OUT is between 0 V and the positive supply voltage VDD, the second field effect transistor J2 becomes conducting and a current I_OUT flows. If the voltage at the output terminal OUT is larger than the positive supply potential VDD, the gate terminal of the second field effect transistor J2 is pumped above the positive reference potential VDD. This is, for example, the case in the time range between 80 μs and 200 μs. The output current I_OUT becomes small. In the case of large voltages at the output terminal OUT (larger than about 10 V), the gate terminal of the first field effect transistor J1 is also pulled up to achieve a voltage division between the first and the second junction field effect transistors J1, J2. The gate potential of the first junction field effect transistor is shown in curve 452. Although a small current of about 5 mA flows in this operating range, the breakdown of the junction field effect transistors is avoided. In the case of a voltage of OUT=24 V at the output terminal OUT, the voltage OUT_OPV at the output of the operational amplifier OPV and thus at the connection of all junction field effect transistors is 14.7 V. Therefore there are 14.7 V−5 V=9.7 V across the drain source path of the first field effect transistor JFET1. However, there is a voltage of 24 V−14.7 V=9.3 V across the drain source path of the second junction field effect transistor J2. Both transistors do not break down in this case.

The simulation results illustrated in FIG. 4 thus show that an inventive circuitry represents an effective protection against polarity inversion and overvoltage. In a normal operating condition, the flowing output current I_OUT is smaller than about 15 mA in amount. Only during a short time duration in which the circuit is started, the current flow increases. This, however, is tolerable because no thermal destruction of an integrated circuit occurs during the short time duration.

In summary, it can be said that the present invention describes a complex system in which an effective protection against overvoltage (OUT>VDD) and against polarity inversion (OUT<0 V) is guaranteed by the introduction of several auxiliary circuits. The circuitry is thus usable as a very comprehensive OBD system.

A substantial element of the present invention is the second junction field effect transistor which combines several functions. It both acts as polarity inversion protection for negative voltages at the output terminal OUT (OUT<0 V) and represents an overvoltage protection for overvoltages at the output terminal OUT (OUT>VDD). The overvoltage protection is particularly effective for extremely large voltages at the output terminal OUT, because, in this case, there will be a voltage division between the first and the second junction field effect transistors J1, J2. Furthermore, the second junction field effect transistor J2 serves as decoupling resistor for the lead lag frequency compensation in a normal operating range of the output circuit (0 V<OUT<VDD).

What is new with respect to prior art is, for example, the fact that the gate terminal of the second junction field effect transistor J2 is driven in a comparatively complicated way. In the polarity inversion case, it is switched to +|Up|, in normal operation it is maintained, with a defined discharge current, at such a low potential that the channel remains well-conducting for all transients in this range, and, in the overvoltage case, it is pumped to a voltage which is equal to the sum of the voltages at the output terminal OUT and the amount of the pinch-off voltage Up (OUT+|Up|).

For the function of the present inventive output circuit, it is further advantageous that, in the polarity inversion case, the node 240 at the output of the operational amplifier, which represents the common point of the first, second and third p-channel junction field effect transistors, is switched to about 0 V or at least to a potential which is less than or equal to that at the gate terminal of the second p-channel junction field effect transistor. This may be done with the help of the operational amplifier OPV or the switch Sopa, but other measures are also conceivable to switch the potential at the respective node to a fixed value. For example, a switched voltage source connected to the output terminal of the operational amplifier may be used for this. The operational amplifier has to be switched to the tri-state operation if the voltage source is connected to the output terminal of the operational amplifier. Such driving guarantees that the second p-channel junction field effect transistor blocks in the polarity inversion case (OUT<0 V).

It also is to be noted that it is difficult to design a simple OBD system. If an OBD system is required, prior art only knows strongly simplified variants which cannot handle overvoltage cases (OUT>VDD) or polarity inversion cases (OUT<0 V). However, maximum protection can also be achieved by an inventive concept including a plurality of auxiliary circuits.

Thus, by combining various overvoltage and polarity inversion protection circuits and by suitable driving, a system may be created that can react to all demands occurring in practice. This is the merit of the present invention. Finally, it is to be noted that the described output circuit, in contrast to conventional circuits, allows monolithic integration into an integrated circuit.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An output circuit for forwarding a signal provided by a circuit via a signal path, the output circuit comprising:
    an input node coupled to the circuit, to receive the signal from the circuit;
    an output node;
    a reference potential terminal;
    a supply potential terminal;
    wherein the input node is separate and distinct from the supply potential terminal and separate from the reference potential terminal;
    wherein the output node is separate and distinct from the supply potential terminal and separate from the reference potential terminal;
    a semiconductor switch within the signal path between the input node and the output node;
    a control circuit designed to open the semiconductor switch, both when the potential at the output node is higher than a first limit potential depending on a potential applied to the supply potential terminal and when the potential at the output node is lower than a second limit potential depending on a potential applied to the reference potential terminal;
    and to close the semiconductor switch when the potential at the output node is between the first limit potential and the second limit potential.

2. The output circuit of claim 1, wherein the semiconductor switch is a normally-on field effect transistor.

3. The output circuit of claim 1, wherein the control circuit is designed to influence a potential at a control terminal of the semiconductor switch and a potential at the input node related to a reference potential applied to the reference potential terminal by outputting control signals.

4. The output circuit of claim 1, wherein the input node of the output circuit is coupled to the output of an amplifier circuit, wherein the output of the amplifier circuit is switchable to a high-ohmic condition.

5. The output circuit of claim 4, wherein an input of the amplifier circuit is optionally couplable to an information carrying signal or a given potential via a switching unit.

6. The output circuit of claim 1, further including a controllable charge pump circuit whose output is coupled to a control terminal of the semiconductor switch.

7. The output circuit of claim 1, further including a current source whose output is couplable to the control terminal of the semiconductor switch.

8. The output circuit of claim 1, further including a voltage source whose output is couplable to the control terminal of the semiconductor switch.

9. The output circuit of claim 1, wherein the semiconductor switch is a normally-on p-channel field effect transistor whose gate terminal serves as control terminal.

10. The output circuit of claim 6, wherein the control circuit is designed to drive the controllable charge pump circuit so that it generates a potential at a gate terminal of a normally-on p-channel field effect transistor which is higher than a potential at the output node by a given potential difference when the potential at the output node is higher than the first limit potential.

11. The output circuit of claim 10, wherein the given potential difference is larger than or equal to a pinch-off voltage of the normally-on p-channel field effect transistor in amount.

12. The output circuit of claim 4, wherein the control circuit is designed to switch the output of the amplifier circuit to a high-ohmic condition when the potential at the output node is higher than the first limit potential.

13. The output circuit of claim 5, wherein the control circuit is designed to couple the voltage source to a gate terminal of the normally-on p-channel field effect transistor and to couple the input of the amplifier circuit to the given potential, wherein the amplifier circuit, the given potential and the voltage source are designed so that, at the input node coupled to a channel terminal of the normally-on p-channel field effect transistor, a potential is applied which is not lower than the second limit potential, and so that, at the gate terminal, a potential is applied which is higher than the potential at the input node by at least a pinch-off voltage of the normally-on p-channel field effect transistor, when the potential at the output node is lower than the second limit potential.

14. The output circuit of claim 7, wherein the control circuit is designed to couple the current source to a gate terminal of a normally-on p-channel field effect transistor when the potential at the output node is between the first and the second limit potential, wherein the current source is designed to keep the potential at the gate electrode of the normally-on p-channel field effect transistor as close as possible to the reference potential.

15. The output circuit of claim 1, wherein the semiconductor switch is a normally-on n-channel field effect transistor whose gate terminal serves as control terminal.

16. The output circuit of claim 6, wherein the control circuit is designed to drive the controllable charge pump circuit so that it generates a potential at a gate terminal of a normally-on n-channel field effect transistor which is lower than a potential at the output node by a given potential difference, when the potential at the output node is lower than the second limit potential.

17. The output circuit of claim 16, wherein the given potential difference is larger than or equal to a pinch-off voltage of the normally-on n-channel field effect transistor in amount.

18. The output circuit of claim 4, wherein the control circuit is designed to switch the output of the amplifier circuit to a high-ohmic condition when the potential at the output node is lower than the second limit potential.

19. The output circuit of claim 5, wherein the control circuit is designed to couple a voltage source to a gate electrode of a normally-on n-channel field effect transistor and to couple the input of the amplifier circuit to a given potential, when the potential at the output node is higher than the first limit potential, wherein the amplifier circuit, the given potential and the voltage source are designed so that, at the input node coupled to a channel terminal of the normally-on n-channel field effect transistor, a potential is applied which is not higher than the first limit potential, and so that, at the gate terminal, a potential is applied which is lower than the potential at the input node by at least the amount of a pinch-off voltage of the normally-on n-channel field effect transistor, when the potential at the output node is higher than the first limit potential.

20. The output circuit of claim 7, wherein the control circuit is designed to couple the current source to a gate terminal of a normally-on n-channel field effect transistor when the potential at the output node is between the first and the second limit potential, wherein the currentsource is designed to keep the potential at the gate electrode of the normally-on n-channel field effect transistor as close as possible to the supply potential.

21. The output circuit of claim 1, wherein the control circuit includes a comparator circuit designed to decide whether the potential at the output node is higher than the first limit potential, between the first and the second limit potential, or lower than the second limit potential, wherein the comparator circuit is designed to detect, starting from a condition in which the potential at the output node is between the first and the second limit potential, a change of the condition only when the potential at the output node is larger than the first limit potential or smaller than the second limit potential for a longer time than a given time duration.

22. The output circuit of claim 20, wherein the given time duration is in a range between 0.1 μs and 10 μs.

23. The output circuit of claim 1, wherein the first limit potential is higher than potential at the supply terminal by between 0.5 V and 5 V.

24. The output circuit of claim 1, wherein the second limit potential is lower than the potential at the reference potential terminal by between 0.5 V and 5 V.

25. The output circuit of claim 1, further including a normally-on field effect transistor whose drain source path is connected between the input node and the reference potential terminal, and whose gate terminal is coupled to an output of a second charge pump which, when there is a sufficient potential difference between the supply potential at the supply potential terminal and the reference potential at the reference potential terminal, generates such a potential that the channel of the normally-on field effect transistor is pinched off.

26. The output circuit of claim 1, further including a normally-on field effect transistor whose drain source path is connected between the input node and the supply potential terminal, and whose gate terminal is coupled to an output of a third charge pump which, when there is a sufficient potential difference between the supply potential at the supply potential terminal and the reference potential at the reference potential terminal, generates such a potential that the channel of the normally-on field effect transistor is pinched off.

27. The output circuit of claim 2, wherein the gate terminal of the third field effect transistor is connected to a drive circuit designed so that a voltage drop across the drain source path of the third field effect transistor is equal to a voltage drop across the drain source path of the first field effect transistor, except for a tolerance, when the potential at the output node is higher than the first limit potential.

28. The output circuit of claim 27, wherein the drive circuit includes a resistive voltage divider.

29. The output circuit of claim 2, wherein a gate terminal of the field effect transistor is connected so that a gate charge is reduced when it is not actively maintained by a circuit.

30. The output circuit of claim 1, wherein the semiconductor switch is formed by several normally-on field effect transistors connected in series.

31. The output circuit of claim 1, further including at least two more normally-on field effect transistors whose drain source paths are connected in series between the input node and the reference potential terminal, and whose gate terminals are coupled to the output of a charge pump which, when there is a sufficient potential difference between the supply potential and the reference potential, generates such a potential that channels of the further normally-on field effect transistors are pinched off.

32. The output circuit of claim 1, further including at least two more normally-on field effect transistors whose drain source paths are connected in series between the input node and the supply potential terminal, and whose gate terminals are coupled to the output of a charge pump which, when there is a sufficient potential difference between the supply potential and the reference potential, generates such a potential that channels of the further normally-on field effect transistors are pinched off.

33. The output circuit of claim 4, wherein an input of the amplifier circuit is coupled to the input node of the output circuit via a capacitor and to the output node of the output circuit via a resistive voltage divider network.

34. The output circuit of claim 33, wherein the capacitor and the resistive voltage divider network are designed so that, in connection with an on-resistance of the semiconductor switch, stability of the amplifier circuit is improved when a capacitive load is coupled to the output node.

35. The output circuit of claim 1, which is monolithically integrated on an integrated circuit.

36. The output circuit of claim 1, wherein the semiconductor switch comprises a first terminal and a second terminal that couple the signal path between the input node and the output node of the output circuit, and further comprising wherein a third terminal of the semiconductor switch comprising a control terminal.

* * * * *